United States Patent
Andreev et al.

(10) Patent No.: US 7,739,575 B2
(45) Date of Patent: Jun. 15, 2010

(54) PIPELINED LDPC ARITHMETIC UNIT

(75) Inventors: Alexander Andreev, San Jose, CA (US); Vojislav Vukovic, Santa Clara, CA (US); Ranko Scepanovic, Saratoga, CA (US)

(73) Assignee: LSI Corporation, Milpitas, CA (US)

( * ) Notice: Subject to any disclaimer, the term of this patent is extended or adjusted under 35 U.S.C. 154(b) by 813 days.

(21) Appl. No.: 11/626,400

(22) Filed: Jan. 24, 2007

(65) Prior Publication Data

US 2008/0178057 A1  Jul. 24, 2008

(51) Int. Cl.
*H03M 13/00* (2006.01)
(52) U.S. Cl. .................. 714/752; 714/758
(58) Field of Classification Search .......... 714/752, 714/758
See application file for complete search history.

(56) References Cited

U.S. PATENT DOCUMENTS

| | | | |
|---|---|---|---|
| 2007/0033482 A1* | 2/2007 | Seki | 714/758 |
| 2007/0089019 A1* | 4/2007 | Tang et al. | 714/752 |

* cited by examiner

*Primary Examiner*—Sam Rizk
(74) *Attorney, Agent, or Firm*—Luedeka, Neely & Graham, P.C.

(57) ABSTRACT

An improvement to an arithmetic unit of a low-density parity-check decoder, where the arithmetic unit has a pipelined architecture of modules. A first module calculates a difference between absolute values of md_R and md_g_in, and passes the result to a first Gallager module. The first Gallager module converts this value from a p0/p1 representation to a $2*p0-1$ representation, and passes the result to a second module. The second module selectively adjusts the result of the previous module based on the sign values of md_g_in and md_R, and passes one of its outputs to a third module (the other two outputs, loc_item_out and hard_out, are not a part of the pipeline). The third module calculates a new md_g value by adding the result of the second module and loc_item_in, and passes this result to a fourth module. The fourth module separates a sign and an absolute value of the new md_g, and passes the result to a second Gallager module. The second Gallager module converts the result from the $2*p0-1$ representation to the p0/p1 representation and the final value leaves the unit as md_g_out. In these calculations, md_R=a check node value from the previous iteration, md_g=an edge value (md_g_in—from the previous iteration, md_g_out—for the next iteration), p0=probability that a value is zero, p1=probability that a value is one, loc_item_in/loc_item_out=intermediate values used for the md_g_out calculation, and hard_out=a bit value estimation for the current iteration of the pipelined arithmetic unit.

1 Claim, 4 Drawing Sheets

PIPELINED LDPC ARITHMETIC UNIT

FIELD

This invention relates to the field of integrated circuit fabrication. More particularly, this invention relates to an arithmetic unit for implementing low-density parity-check (LDPC) codes.

BACKGROUND

Low density parity-check (LDPC) codes were first proposed by Gallager in 1962, and then "rediscovered" by MacKay in 1996. LDPC codes have been shown to achieve an outstanding performance that is very close to the Shannon transmission limit.

LDPC codes are based on a binary parity-check matrix H with n columns and m=n−k rows that has the following properties:

1. Each row consists of p number of "ones;"
2. Each column consists of γ number of "ones;"
3. The number of "ones" in common between any two columns, denoted as λ, is no greater than one; and
4. Both p and γ are small compared to the length of the code and the number of rows in H.

For every given binary source message $u=\{u_0, \ldots, u_{k-1}\}$ of length k, the LDPC encoder builds a binary codeword $v=\{v_0, \ldots, v_{n-1}\}$ of length n where (n>k), such that Hv=0. The codeword consists of two parts. The first k bits of the codeword are equal to the bits of the source message. The other n−k bits of the codeword are the so-called parity-check bits $p=\{p_0, \ldots, p_{n-k-1}\}$. The main task of the encoder is to calculate these parity-check bits p for the given input message u.

To simplify matrix operations, the parity check matrix can be composed of pγ cells. The cells are arranged in p columns and γ rows, as given below.

$$H = \begin{pmatrix} H_{0,0} & \cdots & H_{0,p\ldots1} \\ \cdots & \cdots & \cdots \\ H_{p\ldots1,0} & \cdots & H_{\gamma\ldots1,p\ldots1} \end{pmatrix}$$

Each cell is a t×t permutation matrix (n=pt, n−k=γt). It contains exactly one value of "one" in every row and every columns Therefore, properties (1), (2), and (4) as listed above are satisfied by the construction of the matrix.

Matrix H can be considered as a concatenation of two sub matrices: A and B. Matrix A contains k columns and (n−k) rows. It includes the first k columns of H. Matrix B is a square matrix that contains (n−k) columns and (n−k) rows. It includes the last (n−k) columns of matrix H. The source equation Hv=0 can then be rewritten as Au+Bp=0.

The most famous algorithm for decoding LDPC codes is called the iterative message-passing algorithm. Each iteration of this algorithm consists of two stages. In stage 1 (the row operations), the algorithm computes messages for all of the check nodes (the rows). In stage 2 (the column operations), the algorithm computes messages for all of the bit nodes (the columns), and sends them back to the check nodes associated with the given bit nodes. There are many different implementations of this message-passing algorithm, but all of them use two-stage operations. Further, in each of these implementations, the second step starts only after all of the messages for all of the rows have been calculated.

As with all information processing operations, it is desirable for the procedure to operate as quickly as possible, while consuming as few resources as possible. Unfortunately, LDPC codes such as those described above typically require a relatively significant overhead in terms of the time and the memory required for them to operate.

What is needed is an LDPC code that operates in a more efficient manner, such as by reducing the amount of time or the amount of memory that is required by the operation.

SUMMARY

The above and other needs are met by an improvement to an arithmetic unit of a low-density parity-check decoder, where the arithmetic unit has a pipelined architecture of modules. A first module calculates a difference between absolute values of md_R and md_g_in, and passes the result to a first Gallager module. The first Gallager module converts this value from a p0/p1 representation to a 2*p0−1 representation, and passes the result to a second module. The second module selectively adjusts the result of the previous module based on the sign values of md_g_in and md_R, and passes one of its outputs to a third module (the other two outputs, loc_item_out and hard_out, are not a part of the pipeline). The third module calculates a new md_g value by adding the result of the second module and loc_item_in, and passes this result to a fourth module. The fourth module separates a sign and an absolute value of the new md_g, and passes the result to a second Gallager module. The second Gallager module converts the result from the 2*p0−1 representation to the p0/p1 representation and the final value leaves the unit as md_g_out. In these calculations, md_R=a check node value from the previous iteration, md_g=an edge value (md_g_in—from the previous iteration, md_out—for the next iteration), p0=probability that a value is zero, p1=probability that a value is one, loc_item_in/loc_item_out=intermediate values used for the md_g_out calculation, and hard_out=a bit value estimation for the current iteration of the pipelined arithmetic unit.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

The a posteriori probability of a codeword's bit having a value of either zero or one is calculated in a message passing algorithm module of an iterative LDPC decoding scheme.

Figure 1:
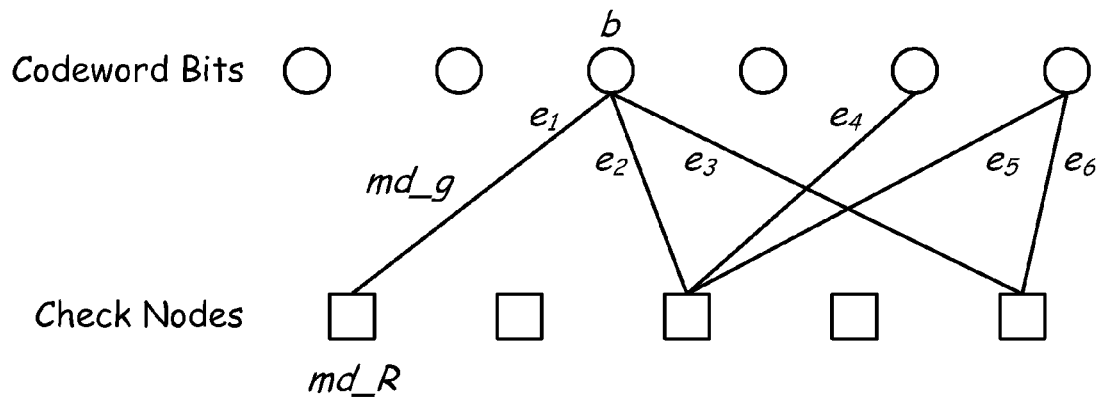
FIG. 1 depicts an excerpt from a Tanner graph, depicting an overview of the computations to be performed by an embodiment of the arithmetic unit according to the present invention, as described herein.

The embodiment of the arithmetic unit described herein is a part of the message passing algorithm, and is used to calculate the probability coefficients (messages) for each edge of the so-called Tanner graph. The process is preferably repeated for every iteration, and the values that are calculated in a preceding iteration are then used in the following iteration. The estimations are based on the fixed point representations of signed and unsigned numbers. FIG. 1 depicts a portion of a Tanner graph, for the purpose of explaining the operation of the unit.

Each check node from FIG. 1 represents one parity equation. For each bit that participates in a given parity equation, there is an edge $e_i$ that connects the codeword bit to the check node, as depicted in FIG. 1. To each edge there is assigned a value md_g from the previous iteration, and to each check node there is assigned a value md_R from the previous iteration. These values are actually the messages in the message passing algorithm that are updated and exchanged between bits and check nodes from iteration to iteration.

Bit b as depicted in FIG. 1 is a part of several parity equations (e1, e2, e3). In a current iteration, for each edge of a codeword bit b, there is first calculated an intermediate value md_g using messages from the previous iteration. Later in the process, the intermediate value will be used for the calculation of the new md_g value for that edge. Since the calculations are preferably performed in the logarithmic domain, md_g for an edge is calculated as a sum of md_g values for all of the other edges that participate in the current parity equation (check node).

For example, for an edge $e_k$ we would have $$\text{md\_g} = \sum_{i \neq k} (\text{md\_g})_i,$$

where $i \neq k$ means that edge $e_k$ for that check node is not included in the summation. For FIG. 1 it would mean, for example, that calculating md_g for $e_2$ would use the md_g values of $e_4$ and $e_5$. The embodiment of the arithmetic unit according to the present invention as described in this example uses the fact that in the decoder implementation (outside of the unit), the value md_R stores the sum of the md_g values for all the edges for that check node, so the particular md_g for an edge is actually acquired by subtracting md_g of that edge from md_R of its check node.

After the process is repeated for every edge of a bit (edges $e_1$, $e_2$, $e_3$ from FIG. 1), a sum of these intermediate md_g values is computed. The final md_g value for a given edge for the current iteration is then obtained in a second loop over the bit's edges. This is done by subtracting the intermediate md_g value from the sum created in the first loop. The estimation of a bit value is preferably done after the first loop, by looking at the sign of the sum. If the sign is positive, then the bit has a value of zero, and if the sign is negative, then the bit has a value of one. Initially, before the first iteration, md_g values for all edges of a bit are set to be equal to the probability coefficients that have come from the Viterbi decoder (these values are labeled in the unit as md_m).

Inputs and Outputs

Figure 2:
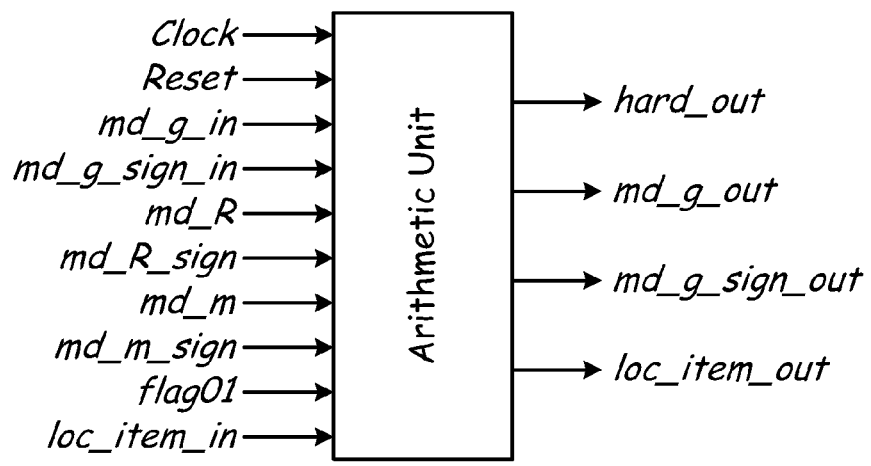
FIG. 2 depicts the inputs and outputs of the arithmetic unit according to an embodiment of the present invention.

The inputs and outputs of the arithmetic unit according to the embodiment of the invention as described herein are shown in FIG. 2. At several stages during the computational process, logarithms are performed. Therefore, md_g, md_R, and md_m values, described in the previous section, are each represented by two ports, to support the logarithm. One port is for the sign of the value (this port as depicted contains '_sign' in its name), and the other port is for the absolute value of the value.

As depicted in FIG. 2, the md_g value from the previous iteration enters the arithmetic unit through the port named md_g_in, and the newly calculated md_g value that is used for the next decoding iteration leaves the arithmetic unit as md_g_out. The port labeled flag01 marks the end of processing for all of the edges of a bit (from FIG. 1 it would be edges $e_1$, $e_2$, and $e_3$ for port b). That clock cycle then starts a new loop where the new values of md_g_out are calculated and output. As described above, these new values are accumulated and used for the calculation of new values of md_R after the entire iteration is completed.

The ports loc_item_in and loc_item_out are used during the md_g calculations. During the first loop, loc_item_out takes out the intermediate md_g value for an edge (as described above) and loc_item_in brings that value back into the arithmetic unit during the second loop, when the final md_g value is calculated. The port hard_out contains the estimation of a bit value after the current iteration.

Internal Structure

Figure 3:
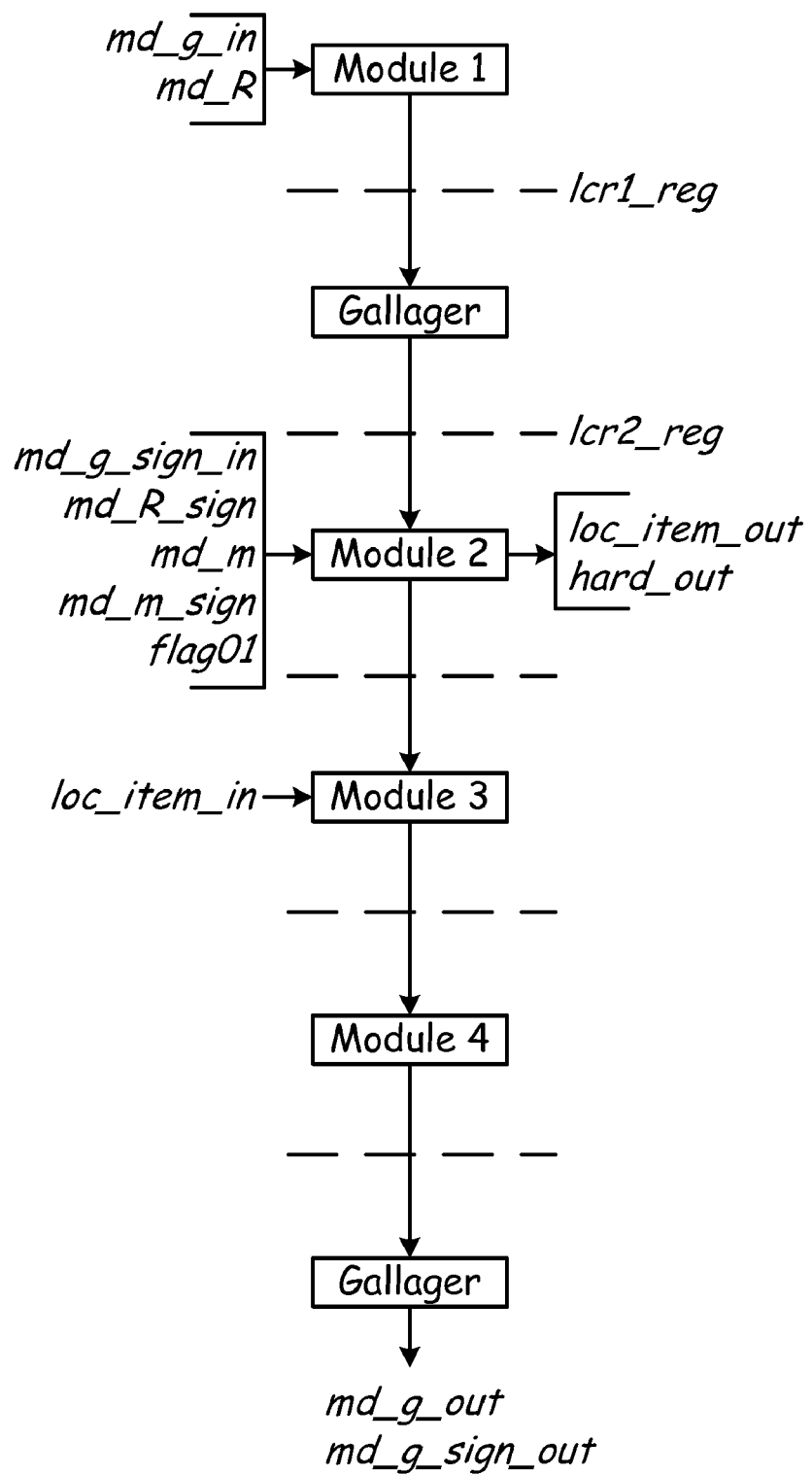
FIG. 3 depicts the pipelined architecture of the arithmetic unit according to an embodiment of the present invention.

The arithmetic unit according to the present invention has a pipelined structure, as depicted in FIG. 3. The dashed lines represent registers that exist between the parameterized blocks. The Gallager modules calculate the function $$B(x) = \ln\left(\frac{1 - e^x}{1 + e^x}\right),$$

and are used for transferring from a $p_0/p_1$ representation to a $2*p_0-1$ representation, and then back again ($p_0$ and $p_1$ are the probabilities that a given bit is equal to zero or one, respectively).

The computations are accomplished using a fixed-point representation for both signed and unsigned numbers, and the number of bits used for integer and fraction sizes is set according to desired arithmetic unit parameters. The ports md_g_in, md_g_out, md_m, md_r, loc_item_in, and loc_item_out can have various sizes depending on their parameter values. The two registers, lcr1_reg and lcr2_reg, one before and the other one after the first Gallager module as depicted in FIG. 3, store values in their own fixed point representations. Throughout the modules, where it is necessary, the transformation from one representation to another is performed.

Figure 4:
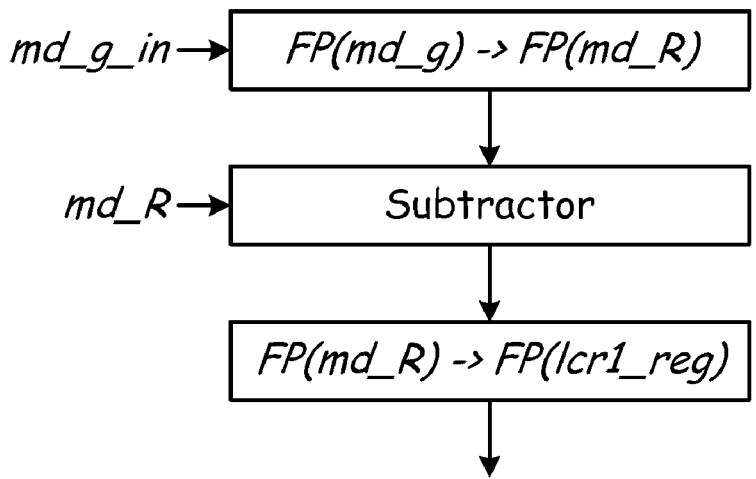
FIG. 4 depicts a module 1 of the arithmetic unit according to an embodiment of the present invention.

Module 1 calculates the difference between the absolute values of md_R and md_g_in. This calculation is depicted in FIG. 4. The module labeled as FP(x)->FP(y) in FIG. 4 performs the transformation from the fixed point representation of x to the fixed point representation of y. The SUBTRACTOR module, as depicted in FIG. 4, performs the subtraction of the two unsigned numbers in the same precision.

Figure 5:
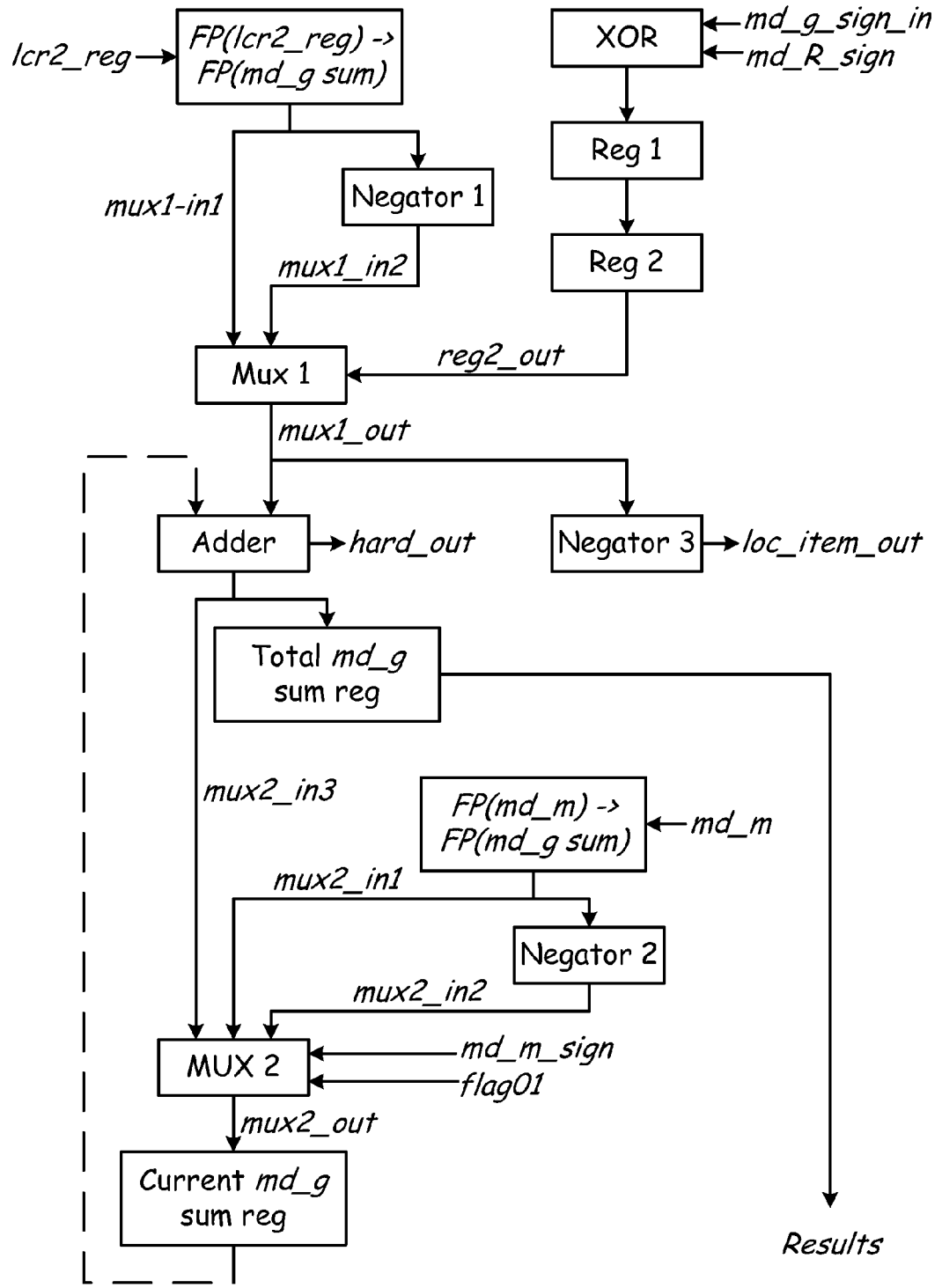
FIG. 5 depicts a module 2 of the arithmetic unit according to an embodiment of the present invention.

Module 2, as depicted in FIG. 5, takes into account the signs of the values md_g_in and md_R, and depending on those signs, MUX 1 adjusts the results of Module 1. Using the names of the nets as depicted in FIG. 5, the output of the multiplexer MUX 1 is given by the equation mux1_out=reg2_out ? mux1_in2: mux1_in1.

The three modules depicted in FIG. 5 as NEGATOR 1, NEGATOR 2, and NEGATOR 3 perform the negation of their input values using the expression $2^s-x$, where x is the input and s is the width of x. The module ADDER depicted in FIG. 5 is an adder of the signed numbers, under the control of the minimum and maximum output values. The accumulation of the sum of md_g values for all of the edges of a bit is performed with the ADDER and the 'Current md_g sum reg' register (the sum is represented as a signed number with the fixed precision).

The MUX 2 block controls the accumulation or the initialization of the 'Current md_g sum reg' with its two select bits: md_m_sign and flag01. The output of MUX 2 is determined using the expression: mux2_out=flag01 ? (md_m_sign ? mux2_in2: mux2_in1): mux2_in3. As this expression shows, at the start of each bit cycle, such as before the first edge of a bit is processed (indicated by toggling the bit port flag01), the sum is initialized with a value of md_m (negated or not through NEGATOR 2, depending on its sign bit md_m_sign). As it can be seen in FIG. 5, md_m is transformed before that operation into the internal representation of the sum.

When all of the edges of a bit have been processed (toggled bit flag01), the sum then goes to the flag01 controlled register 'Total md_g sum reg.' It is then taken through the pipeline to Module 3. Port flag01 also determines the time at which an estimated bit value, hard_out, is output of the arithmetic unit, representing the sign of the accumulated sum. The value of port loc_item_out is updated for each edge of a given bit, and is actually a negated intermediate md_g value. The value leaves Module 2 and is subsequently returned to the arithmetic unit as the input to Module 3 in the second loop through edges.

Figure 6:
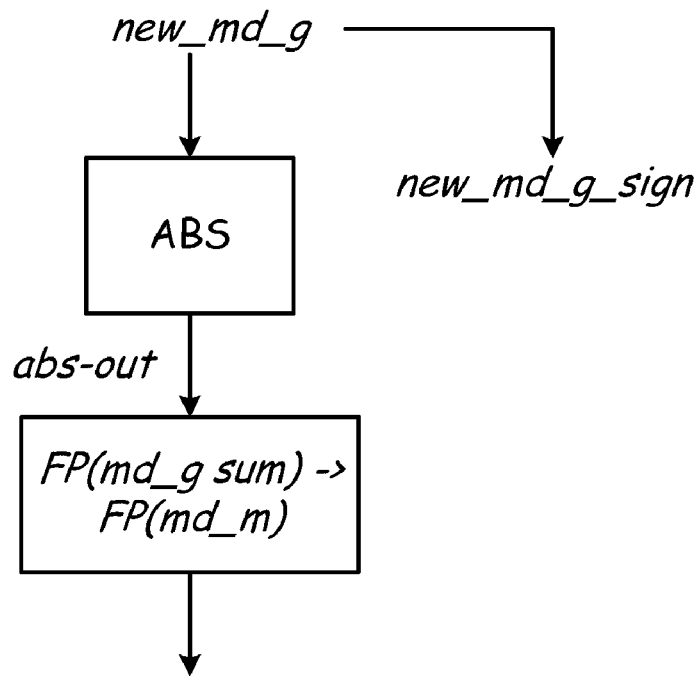
FIG. 6 depicts a module 4 of the arithmetic unit according to an embodiment of the present invention.

Module 3 is an adder of signed numbers, such as depicted as ADDER in FIG. 5, having just a different width, which processes edges in the second loop through the edges. Module 3 calculates the new md_g value for the next iteration by adding loc_item_in and the output of Module 2, 'Total md_g sum reg.' Module 4 separates the sign and the absolute value of this new md_g (new_md_g in FIG. 6, with a sign bit new_md_g_sign), and then sends them to the next pipeline stage. The absolute value is calculated in the module 'ABS' as depicted in FIG. 6, using the expression: abs_out=(1−2*new_md_g_sign)*new_md_g. This is the point where the transition back from the computation with signed numbers to the unsigned numbers is made.

The final recalculation is done in the second Gallager module depicted in FIG. 2, where we go from the form of 2*$p_0$−1 to the $p_0/p_1$ form of the probability coefficient md_g. The md_g value enters the Gallager module in one representation, FP(md_m), and leaves it as md_g_out in the same representation as that of md_g_in. The integer and fraction sizes choices that are used for the actual implementation are given in Table 1 below:

TABLE 1

| Fixed point representations of signals | |
|---|---|
| Signals | Integer · Fraction |
| md_g_in, md_g_out | 1.8 |
| loc_item_in, loc_item_out | 6.4 |
| md_R | 2.8 |

TABLE 1-continued

| Fixed point representations of signals | |
|---|---|
| Signals | Integer · Fraction |
| md_m | 4.2 |
| lcr1_reg | 1.8 |
| lcr2_reg | 2.4 |

The foregoing description of preferred embodiments for this invention has been presented for purposes of illustration and description. It is not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. In a low-density parity-check decoder of the type having an arithmetic unit, the improvement comprising the arithmetic unit having a pipelined architecture of modules, including:

a first module adapted to calculate a difference between absolute values of md_R and md_g_in, and pass results to a first Gallager module, the first Gallager module adapted to convert the results from a $p_0/p_1$ representation to a 2*$p_0$−1 representation, and pass the results to a second module, the second module adapted to selectively adjust the results based on sign values of md_g_in and md_R, and pass the results to a third module, the third module adapted to calculate a new md_g value by adding the results and loc_item_in, and pass the results to a fourth module, the fourth module adapted to separate a sign and an absolute value of the results, and pass the results to a second Gallager module, and the second Gallager module adapted to convert the results from the 2*$p_0$−1 representation to the $p_0/p_1$ representation, where, md_R=a check node value from a previous iteration of the pipelined arithmetic unit, md_g_in=an edge value from the previous iteration, p0=probability that a value is zero, p1=probability that a value is one, and loc_item_in=an intermediate edge value.

* * * * *